US009679089B2

(12) United States Patent
Stokoe et al.

(10) Patent No.: US 9,679,089 B2
(45) Date of Patent: Jun. 13, 2017

(54) METHODS AND SYSTEMS FOR MAPPING AND PROCESSING BUILDING INFORMATION MODELING (BIM)-BASED DATA

(71) Applicant: Viewpoint, Inc., Portland, OR (US)

(72) Inventors: Richard Stokoe, Tyne and Wear (GB); Laurence Skoropinski, Durham (GB); Andrew Thomson, Blaydon (GB); Andrew Burden, Newcastle-upon-Tyne (GB); Lloyd Pickering, Durham (GB)

(73) Assignee: Viewpoint, Inc., Portland, OR (US)

( * ) Notice: Subject to any disclaimer, the term of this patent is extended or adjusted under 35 U.S.C. 154(b) by 188 days.

(21) Appl. No.: 14/491,782

(22) Filed: Sep. 19, 2014

(65) Prior Publication Data
US 2015/0088916 A1 Mar. 26, 2015

Related U.S. Application Data

(60) Provisional application No. 61/880,370, filed on Sep. 20, 2013.

(51) Int. Cl.
*G06F 17/30* (2006.01)
*G06F 17/50* (2006.01)
(Continued)

(52) U.S. Cl.
CPC ...... *G06F 17/5004* (2013.01); *G06F 3/04815* (2013.01); *G06F 3/04842* (2013.01);
(Continued)

(58) Field of Classification Search
CPC .... G06F 3/048; G06F 3/04815; G06F 3/0482; G06F 3/0484; G06F 17/5004;
(Continued)

(56) References Cited

U.S. PATENT DOCUMENTS 8,306,883 B2 11/2012 Allin et al.
8,400,467 B1 3/2013 Ponce de Leon
(Continued)

FOREIGN PATENT DOCUMENTS

EP 2629210 A1 8/2013
KR 20100020060 A 2/2010

OTHER PUBLICATIONS

Wikipedia, "COBie", Jul. 21, 2016, Wikipedia, https://en.wikipedia.org/wiki/COBie, p. 1-1.*
(Continued)

*Primary Examiner* — Cheryl Lewis
(74) *Attorney, Agent, or Firm* — McCoy Russell LLP

(57) ABSTRACT

A method for operating a building information modeling (BIM) system is provided. The method includes at a BIM server, in response to receiving a save tri-dimensional data command from a client computing device, associatively mapping identification data in each of a building model, a hierarchical structure of building model data, and a Construction Operations Building Information Exchange (COBie) spreadsheet and storing a representation of the associative mapping of the identification data for display in at least one of the BIM server and a client computing device in electronic communication with the server over a network.

15 Claims, 13 Drawing Sheets

(51) Int. Cl.
H04L 29/06 (2006.01)
G06F 3/0481 (2013.01)
H04L 29/08 (2006.01)
G06F 3/0484 (2013.01)
G06F 17/24 (2006.01)

(52) U.S. Cl.
CPC ...... *G06F 17/246* (2013.01); *G06F 17/30289* (2013.01); *H04L 67/10* (2013.01); *H04L 67/42* (2013.01)

(58) Field of Classification Search
CPC .............. G06F 17/5072; G06F 17/246; G06F 17/30289; G06F 17/30292; G06F 17/30294; H04L 67/10
See application file for complete search history.

(56) References Cited

U.S. PATENT DOCUMENTS

| | | | |
|---|---|---|---|
| 2008/0172208 | A1 | 7/2008 | Lechine |
| 2010/0106654 | A1* | 4/2010 | Simpson ............. G06F 17/5004 705/300 |
| 2012/0066178 | A1 | 3/2012 | Omansky et al. |
| 2012/0203806 | A1 | 8/2012 | Panushev |
| 2013/0169681 | A1 | 7/2013 | Rasane et al. |
| 2013/0218924 | A1 | 8/2013 | Kim et al. |
| 2013/0339078 | A1* | 12/2013 | Harris ..................... G06Q 50/08 705/7.23 |
| 2014/0129912 | A1* | 5/2014 | Kannala ................. G06F 17/246 715/215 |
| 2014/0214215 | A1* | 7/2014 | Han ........................ G05B 15/02 700/276 |
| 2015/0088467 | A1 | 3/2015 | Skoropinski et al. |
| 2015/0089344 | A1 | 3/2015 | Pickering et al. |

OTHER PUBLICATIONS

Tien-Hsiang Chuang, Bo-Cing Lee, and I-Chen Wu, "Applying Cloud Computing Technology to BIM Visualization and Manipulation", pp. 144-149, 28th International Symposium on Automation and Robotics in Construction: ISARC 2011, Jul. 2011.*

"Get Real with BIM," YouTube Video Uploaded by Kimon Onuma on Nov. 13, 2010, https://www.youtube.com/watch?v=RnHPj77lg-l, 2 pages.

"Demystifying COBie Standards and How to Integrate Them Into BIM Based Applications," YouTube Video Uploaded by FiatechWebinars on Jun. 6, 2012, https://www.youtube.com/watch?v=vf010XZ_7-Y, 2 pages.

"Who Will Run the World for the Next 100 Years?: Desmond Wheatley at TEDxAmericasFinestCity," YouTube Video Uploaded by TEDx Talks on Nov. 4, 2012, https://youtube.com/watch?v=FL864c4gqC0, 2 pages.

AEC Magazine Website, "4Projects BIM in a Browser," Available at http://aecmag.com/technology-mainmenu-35/559-4projects-bim-in-a-browser, Published Apr. 9, 2013, 4 pages.

ISA Korean Intellectual Property Office, International Search Report and Written Opinion Issued in Application No. PCT/US2014/056597, Jan. 2, 2015, WIPO, 10 pages.

Singh, V. et al., "A Theoretical Framework of a BIM-Based Multi-Disciplinary Collaboration Platform," Automation in Construction, vol. 20, No. 2, Mar. 2011, 11 pages.

Chuang, T. et al., "Applying Cloud Computing Technology to BIM Visualization and Manipuiation." 28th International Symposium on Automation and Robotics in Construction: ISARC 2011, Jul. 2011, 6 pages.

European Patent Office, Extended European Search Report Issued in Application No. 14185259.0, Feb. 18, 2015, Germany, 8 pages.

* cited by examiner

METHODS AND SYSTEMS FOR MAPPING AND PROCESSING BUILDING INFORMATION MODELING (BIM)-BASED DATA

CROSS REFERENCE TO RELATED APPLICATION

This application claims priority to U.S. provisional patent application, Ser. No. 61/880,370, entitled "PROCESSING BUILDING INFORMATION MODELING (BIM)-BASED DATA" filed on Sep. 20, 2013, the entire disclosure of which is herein incorporated by reference.

FIELD OF THE INVENTION

The present invention relates to managing Building Information Modeling (BIM) based data.

BACKGROUND

Building Information Modeling (BIM) is a digital representation of physical and functional characteristics of a facility. A BIM is a shared knowledge resource for information about a facility forming a reliable basis for decisions during its life-cycle. In addition to the geometry of a facility, BIM data can also describe further information, such as spatial relationships, light analysis, geographic information, and quantities and properties of building components (e.g., manufacturers' details).

It is known to provide collaborative BIM software tools that enable several users, including ones at geographically remote sites, to work on the same BIM-based project (e.g., building model). An exemplary BIM based project platform is 4BIM, produced by 4Projects. This can allow any project member to review and interact with 3-dimensional building models using a World Wide Web browser. In some instances, it is desirable for one user to manipulate the BIM-based data in a certain way (e.g., modify an image of the facility represented by the data), and for the other users to watch that manipulation substantially in real time, or at least with minimal delay. Conventionally, this type of "screen sharing" involves taking a sequence of snapshots/images of the "master" screen and sending bitmap data representing those to each client over a network, such as the Internet. There are known techniques to reduce the amount of data sent to the devices, such as detecting what has changed since the last image was generated and only sending that portion of the image, but such conventional techniques still ultimately rely on streaming image data at a rate of something like 10 per second minimum (and in many cases 24/25/30 per second). Moreover, it may be desirable for the users to view other information pertaining to building models, such as COBie data corresponding to specific objects within the model. However, 4BIM does not provide such functionality. Therefore, the users may have to access additional programs locally or remotely to facilitate viewing of other related data, such as COBie data, decreasing the data management efficiency of the users. In some cases, a user may have to use multiple computing devices to enable access to a building model as well as COBie data.

SUMMARY OF THE INVENTION

Embodiments of the present invention are intended to address at least some of the abovementioned problems. As such in one example, a method for operating a building information modeling (BIM) system is provided. The method includes at a BIM server, in response to receiving a save data command from a client computing device, associatively mapping identification data in each of a building model, a hierarchical structure of building model data, and a Construction Operations Building Information Exchange (COBie) spreadsheet and storing a representation of the associative mapping of the identification data for display in at least one of the BIM server and a client computing device in electronic communication with the server over a network. In one example, the building model includes a 3-dimensional rendering of a structure. Further in one example, the hierarchical structure of building model data is a hierarchical tree structure. Further in one example, the COBie spreadsheet is a spreadsheet conforming to predetermined standards. In this way, the building model, hierarchical structure, and COBie spreadsheet can be associatively linked and saved. As a result, a current BIM session where the user is viewing and manipulating the building model, hierarchical structure, and COBie spreadsheet can be saved on a remote server, enabling quick access of current information in the 3 data structures at a later time by a number of users. As a result, coordination between large amounts of data across different aspects of building construction design can be provided. For instance, an engineer may create data in the building model generating corresponding data in the hierarchical structure and COBie spreadsheet. In turn, the hierarchical structure and COBie spreadsheet data can be viewed and manipulated at later time and/or added to by a construction foreman, for instance.

Additionally, when the building model, hierarchical structure, and COBie spreadsheet are linked in this way the computing efficiency of the server is increased due mapping of the data when compared to computing systems which separately execute, access, and save building data via different programs. Moreover, when the building model, hierarchical structure, and COBie spreadsheet are executed on a remote server the storage capacity and/or processing power of the server can be leveraged to reduce the storage capacity and/or processing power of the client device, if desired. Additionally, when the data in the building model, hierarchical structure, and COBie spreadsheet is linked in this way greater consistency between the data sets is provided.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments. As such, many modifications and variations will be apparent to practitioners skilled in the art. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DETAILED DESCRIPTION

Aspects of this disclosure will now be described by example and with reference to the illustrated embodiments. Components and other elements that may be substantially the same in one or more embodiments are identified coordinately and are described with minimal repetition. It will be noted, however, that elements identified coordinately may also differ to some degree. It will be further noted that the drawings included herein are schematic and generally not drawn to scale. Rather, the various drawing scales, aspect ratios, and numbers of components shown in the figures may be purposely distorted to make certain features or relationships easier to see. Therefore, the figures are not intended to be technically precise, but are drawn to ease understanding.

A system and method for associatively mapping data for display in a building model, a hierarchical structure of building model data, such as a tree structure, and a Construction Operations Building Information Exchange (COBie) spreadsheet. In this way, building data generated via different programs, modules, etc., may be associatively linked to provide coordination of a large amount of data across different aspects of building construction design. For instance, the data may be first uploaded by an architect in a design stage and then subsequently used by maintenance personnel to maintain various building systems, structures, etc. In this way, the efficiency of data management in building design, construction, and maintenance is increased. As a result, users of the system, such as architects, engineers building contractors, maintenance staff, etc., can quickly and efficiently retrieve relevant data during different stages in a building's life-span. As a result, productivity of users of the BIM system at every stage in a building's lifecycle can be increased and the efficiency of data management in the server can also be increased.

Figure 1:
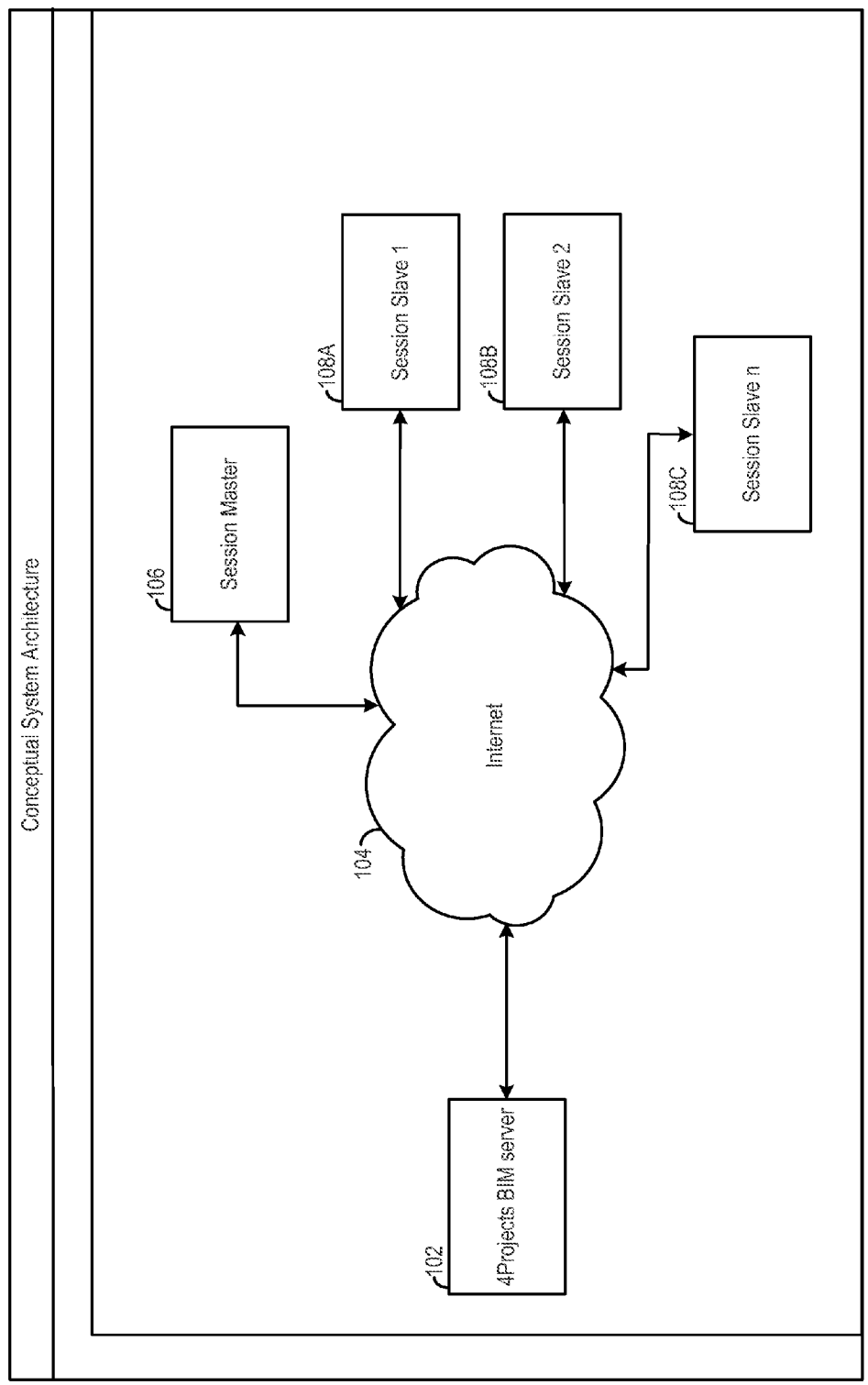
FIG. 1 shows a schematic drawing of a set of computing devices configured to process BIM-based data.

FIG. 1 shows a server computing device 102 connected via a network 104 to a session master computing device 106 and a set of session slave computing devices 108A-108C. Each computing device may include a processor and memory, but it will be understood that the functions performed and the data used could be distributed over a plurality of computing devices and/or storage devices, including a cloud computing arrangement. In practice, the session master and the session slave devices may be similar in terms of hardware and it is the functions performed by the device's user that determines whether they are master or slave devices in the system.

At least the master 106 and slave 108 computing devices will normally have, or be associated with, a display device and user interface device (e.g., keyboard, mouse or graphics tablet, etc.) These components will be well known to the person skilled in the art and are not illustrated or described herein in detail. The communications between the various devices may be via any suitable wired or wireless communication structure (e.g., network). The example shows three slave devices, but it will be understood that any reasonable number (e.g., from one upwards) could be included.

The server device 102 executes code on its processor that allows it to process building information modeling (BIM)-based data in various ways, such as creating, displaying and/or editing models (e.g., via routines such as those included in the 4BIM package mentioned above) and also transfer related data to/from the master 106 and slave 108 devices over the network 104. It will be understood that "BIM-based data" can include building-related information according to any version and/or format of BIM. The data may be stored using any suitable data structure or arrangement and in some cases may be compressed and/or encrypted for storage and/or transmission.

Figure 4:
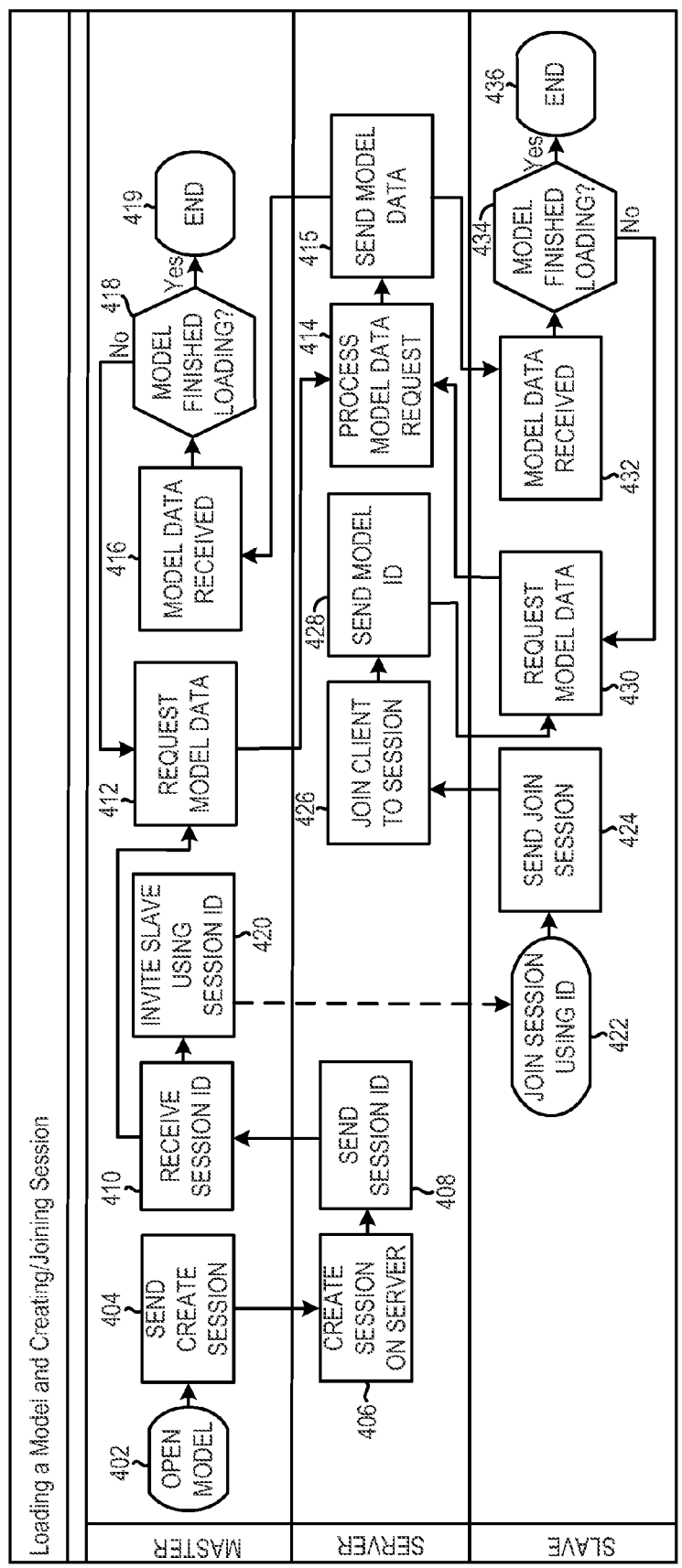
FIG. 4 shows a more detailed view of the BIM server shown in FIG. 2.

In use, the code stored in memory executed via a processor on the server device 102 can perform steps including loading a model represented by BIM-based data and allowing users of the master 106 and the slave 108 devices to create and/or join a session relating to the model as illustrated in FIG. 4. Code stored in memory executable via a process may also perform the other methods described herein. It will be understood that the code and data can be implemented using any suitable programming language(s) and data structures. It will be appreciated that the steps shown in all of the flowcharts herein are exemplary only, and that in alternative embodiments some of them could be omitted, re-ordered or performed concurrently. Additional steps could also be included.

The example implementation detailed herein is based on the server device 102 controlling communication between the other devices (106 and 108). However, it will be understood that in alternative embodiments, at least some of the functions performed by the server device could be performed by one or more of the master/slave devices (e.g., a user could effectively directly use an application running on a master device to exchange data with the slave device(s) without the need for a server).

Figure 2:
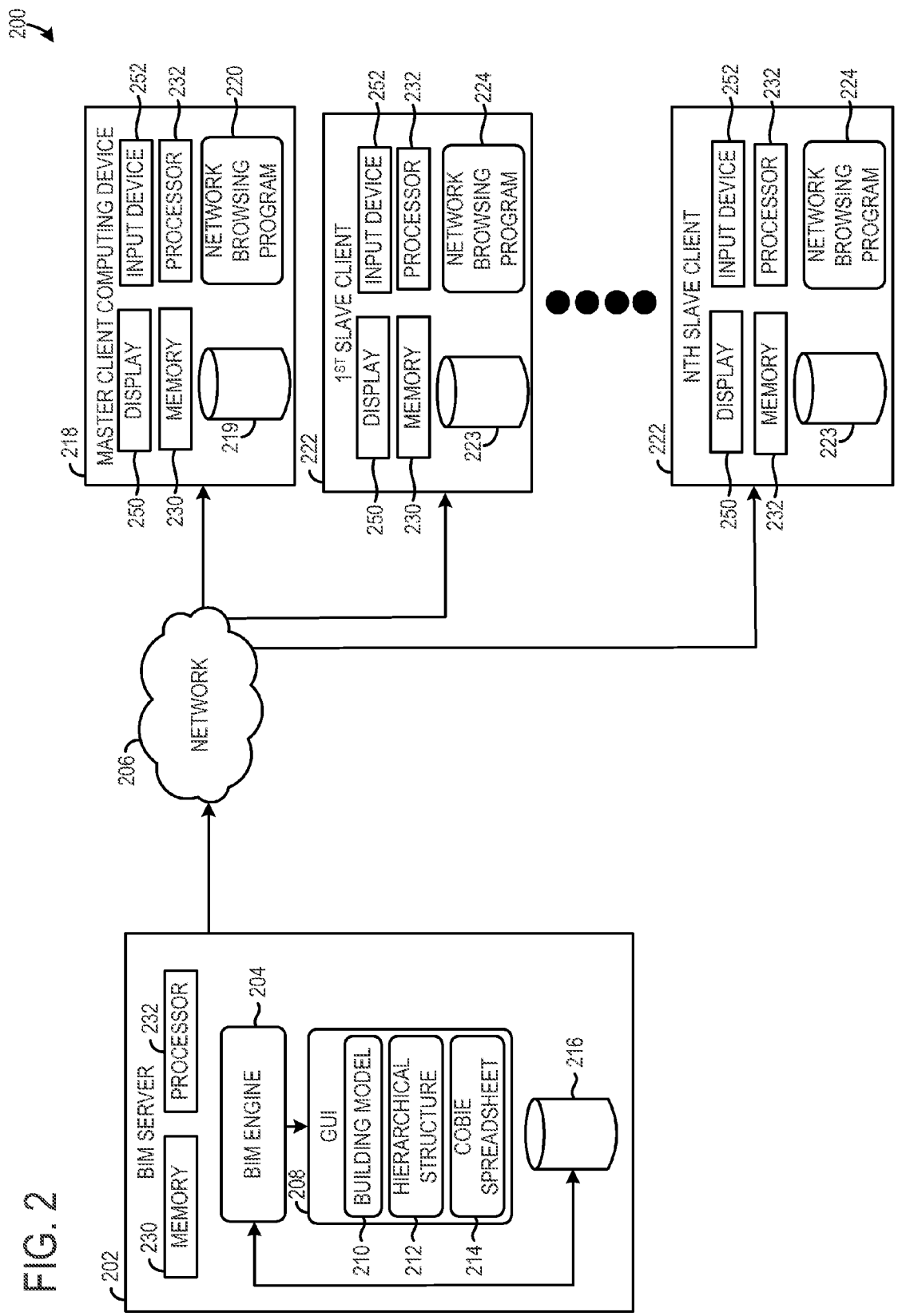
FIG. 2 shows a schematic depiction of a BIM system including a BIM server, master client computing device, and a plurality of slave client computing devices.

FIG. 2 shows a BIM system 200. The BIM system 200 is configured to efficiently manage data with regard to building construction, building operations, and/or building repairs. Thus, the BIM system 200 provides a single platform to manage building data over various stages in the building lifecycle. It will be appreciated that a building may encompass any man made structure or group of structures such as a facility.

The BIM system 200 includes a BIM server 202. The BIM server 202 includes a network-based BIM engine 204. The network-based BIM engine 204 may be configured to manage BIM data and enable client computing devices to access the BIM data over a network 206. The network 206 may be the Internet, in one example. However, other suitable networks have been contemplated such as a local area network (LAN), a wide area network (WAN), a virtual private network (VPN), etc. Specifically, the network-based BIM engine 204 may be configured to generate a graphical user interface (GUI) 208 including each of a building model 210, a hierarchical structure of building model data 212, and a construction operation building information exchange (COBie) spreadsheet 214.

The building model 210 may include a 3-dimensional representation of objects in the building model. The objects may include components, systems, and structures in the building. The systems may include heating systems, plumbing systems, cooling systems, and/or electrical systems. Additionally, the structures include one or more of a door, a room, and/or a wall.

Additionally, the hierarchical structure of building model data 212 may be a directory structure such as a tree structure including graphical representations of sections, floors, systems, etc., and sub-directories of the sections, floors, systems such as rooms, components, structures, parts, etc., in one example. In this way, a user may easily view the conceptual arrangement of various features of the building.

Furthermore, the COBie spreadsheet 214 may include at least one or more of an equipment list, a product data sheet, a warranty, a spare parts list, and/or a preventative maintenance schedule in a COBie format. It will be appreciated that the COBie spreadsheet may include non-geometric data associated with various components, structures, etc., in the building model.

Additionally, it will be appreciated that COBie is an internationally recognized data exchange standard. COBie data includes building systems information between design and construction. COBie may be in different formats, such as an Excel format and/or an Excel spreadsheet format. In one example, the COBie data may be limited to a predetermined number of rows, such as a maximum of 65,536 rows. Additionally, the COBie data may also be COBieLite data in an extensible markup language (XML) format. COBie enables data relevant to building systems management to be quickly transferred to owner/operators of the building after the building is designed and constructed. Exemplary COBie data may include floor space, occupancy level, operation costs, maintenance schedule, energy use estimates, etc. It will be appreciated that COBie data may have a plethora of additional uses, such as capturing survey information, documentation of maintenance issues, coordinating maintenance records, etc.

The COBie data can be color coded. Specifically, columns in the COBie data may be color coded in yellow, orange, purple, and green. The yellow color coding indicates a required data such a key, date, building information, etc. The orange color coding indicates reference and/or lookup data, such as a picklist, user, etc. The purple color coding indicates data that is automatically inserted by the system. Additionally, the green color coding indicates data that may be required if specified by the consumer or contract, for example. In this way, the COBie spreadsheet can be color coded according to a predetermined standard.

Additionally, the building model 210, the hierarchical structure of building model data 212, and the COBie spreadsheet 214 may be associatively liked via common identification data, such as a common identification number.

The BIM engine 204 may be configured to validate one or more cells in the COBie spreadsheet 214. Specifically, the BIM engine 204 may be configured to compare COBie data in the COBie spreadsheet 214 stored in a database 216 with predetermined validation requirements. Additionally, in one example the validation may be implemented in real-time. It will be appreciated that versions of the building model 210 and/or hierarchical structure of building model data 212 may also be stored in the database 204.

A master client computing device 218 is also included in the BIM system 200. It will be appreciated that the master client computing device 218 may more generally be a client computing device in electronic communication with the BIM server 202 via the network 206. Additionally, the master client computing device 218 may be configured to access the GUI generated by the BIM engine 204. A network browsing program 220, such as a web-browser, may be used to access the GUI generated by the BIM engine 204, in one example. Additionally, the master client computing device 218 is configured to control the BIM engine 204. For instance, the master client computing device 218 is configured to input, delete, overwrite, etc., data in the building model 210, the hierarchical structure of building model data 212, and/or the COBie spreadsheet 214. In this way, the master client computing device 218 can remotely control the BIM engine 204 via the network connection. As a result, a user may access the BIM engine from a variety of remote locations, if desired.

The master client computing device 218 is also configured to send a save data command to the BIM engine 204. The save data command is configured to request associative mapping between identification data in each of the building model 210, a hierarchical structure of building model data 212, and the COBie spreadsheet 214. Additionally, a representation of the associatively mapped data may be stored in either the BIM server 202 and/or the master client computing device 218. The representation of the associatively mapped data may include viewing coordinates and/or vectors as well as a common identification number. Additionally, the representation of the associatively mapped data may not include graphical building data, in one example. Furthermore, the master client computing device 218 may include a database 219.

A plurality of slave client computing devices 222 are also included in the BIM system 200. Each of the slave client computing devices 222 is configured to passively access the BIM engine 204. Therefore in one example, the slave client computing devices 222 may be inhibited from controlling the BIM engine 204. The slave client computing devices 222 may be configured to view a session with the BIM engine 204 controlled via the master client computing device 218. Specifically, network browsing programs 224 included in each of the slave client computing devices 222 may be configured to facilitate passive access to the BIM engine 204. In this way, a plurality of computing devices may access the BIM engine 204 enabling a meeting with remotely located participants to be implemented, if desired. Specifically, the slave client computing devices 222 may passively view the GUI 208. Additionally, the slave client computing device 222 may include databases 223.

The BIM server 202, master client computing device 218, and the slave client computing devices 222 each include memory 230 holding instructions executable by a processor 232. Therefore, it will be appreciated that the methods and other functionalities described herein with regard to the BIM server and client computing devices may be stored in memory executable by a processor. Moreover, it will be appreciated that the memory and the processor in each of the aforementioned devices may not be equivalent, in one example. Additionally, each of the master client computing device 218 and the slave client computing devices 222 includes a display 250 and an input device 252. The displays 250 are configured to present visual information and the input devices 252 are configured to provide data and control signals to the device in response to user input. Example displays include liquid crystal displays (LCDs), touch displays, OLED displays, etc. Example input devices include keyboards, trackpads, mice, touch interfaces, etc. It will be appreciated that the types of displays and/or input devices may vary between computing devices, in one example.

Figure 3:
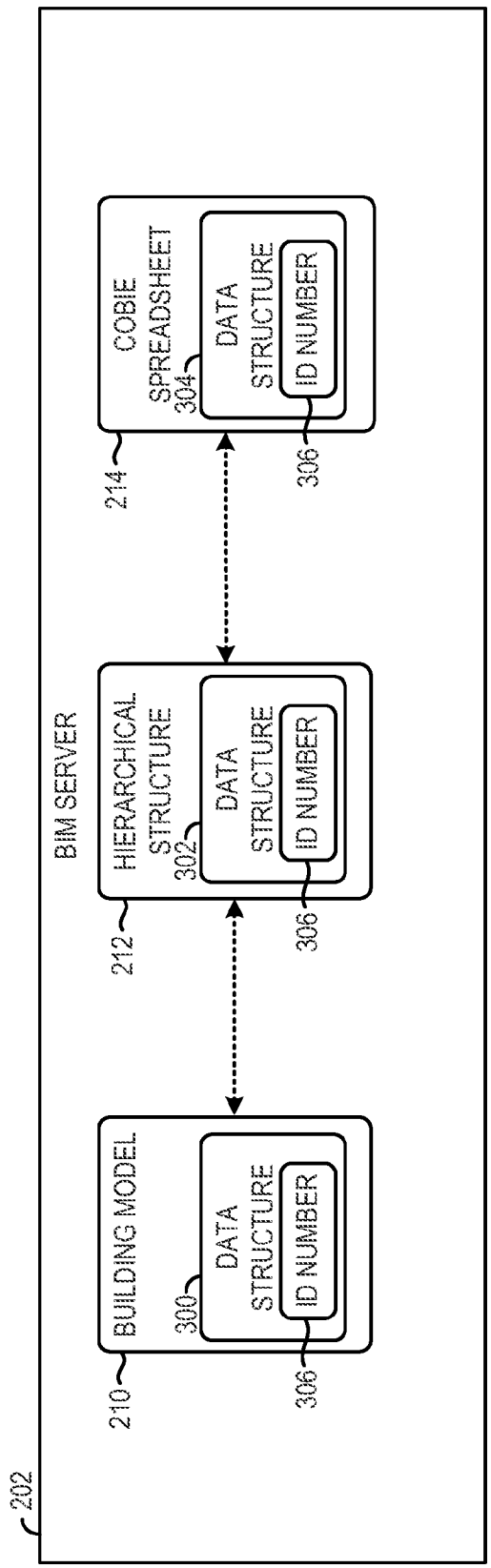
FIG. 3 shows a flowchart showing example steps involved in setting up a session for sharing BIM-based data.

FIG. 3 shows an example of how data is linked in the BIM server 202. Again, the building model 210, hierarchical structure 212, and COBie spreadsheet 214 are shown. Each of the building model 210, hierarchical structure 212, and COBie spreadsheet 214 include data structures 300, 302, and 304, respectively. These data structures each include a common identification number 306. Additionally or alternatively, in other examples other types of identification data may be used such as a bar codes, QR codes, etc. The common identification number enables these 3 separate data structures to be linked for retrieval and viewing. In one example, the COBie spreadsheet and the hierarchical structure are generated from a source file (e.g., a source Industry Foundation Classes (IFC) file) and when generating the COBie spreadsheet and the hierarchical structure the spreadsheet and structure may be appended with a Globally Unique Identifier (GUID). In this way, identifiers can be used to link the hierarchical structure and COBie spreadsheet. It will be appreciated that the building model can be linked to the other data structures in this same way.

At step 402 of FIG. 4, a user of the master device 106, shown in FIG. 1 opens a model (e.g., by creating a new model or loading BIM-based data from an existing file). This can typically involve connecting to the server device 102 by means of a world wide web (WWW) browser running on the master device and accessing a webpage/application that interacts with the code executing on the server device (this may involve the user providing a user identifier and password) and then selecting a "create/load new model" option or the like. After this, at step 404, the master device sends a message to the server device indicating that a new session is to be created. At step 406 the server device creates the new session and at step 408 the server device transfers an identifier for the session, which is received by the master device at step 410.

After the session identifier has been received, at step 412 the master device 106 requests the model data as currently stored by the server device 102 and at step 414 this request is received by the server device. At step 415, the server device transfers the model data and it is received by the master device at step 416. At step 418, the master device checks whether all the model data has been received/finished loading; if not then the method returns to step 412 to continue transfer of the model data. When the model data has finished loading then the process of the master device creating the session can end at step 419.

If the user of the master device 106 wants to invite one of the slave devices 108 (e.g., device 108A) to join the session so that the user of that slave device can collaborate in relation to the model then at step 420 the master device user selects an appropriate option on the web page/application for sending an invitation to the slave device. At step 422, the invitation is received at the slave device, which is also in communication with the server device 102 web page/application, (e.g., after logging in by providing a username and password). The invitation includes the session identifier and at step 424 the user of the slave device can accept the invitation and a message is sent to the server device (received at step 426) indicating that the slave device is joining the session as a client. This results in the identifier of the model accessed by the master device being retrieved and at step 428 the identifier is sent to the slave device. At step 430 the slave device requests the model data corresponding to the identifier from the server device. The server device then performs steps 414 and 415 as described above, but in relation to the slave device rather than the master device, with the slave device receiving the model data at step 432. At step 434, the slave device checks whether all the model data has been received/finished loading; if not then the method returns to step 430 to continue transfer of the model data. When the model data has finished loading then the process of the slave device joining the session can end at step 436.

Figure 5:
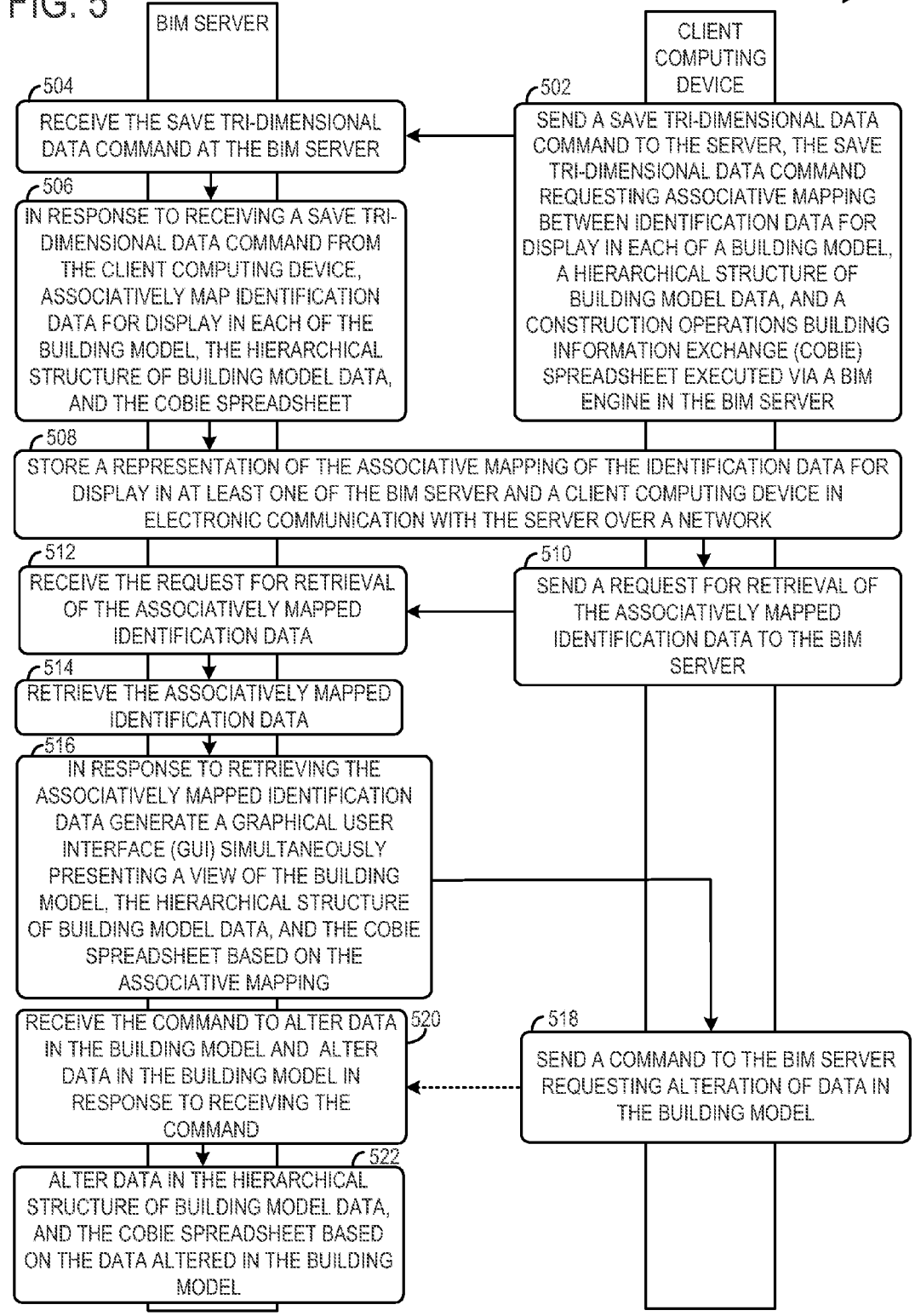
FIGS. 5-6 show various methods for operating BIM systems.

FIG. 5 shows a method 500 for operating a BIM system. The BIM system may be the BIM system 200 discussed above with regard to FIG. 2, in one example. However, in another example other suitable BIM systems may be used to implement the method 500.

At 502 the method includes at a client computing device sending a save tri-dimensional data command to the server, the save data command requesting associative mapping between identification data for display in each of a building model, a hierarchical structure of building model data, and a COBie spreadsheet executed via a BIM engine in the BIM server. It will be appreciated that the save data command may be input by a user of the client computing device via a suitable input device such as a keyboard, touch interface, mouse, etc. Furthermore, the client computing device electronically communicates with the BIM server over a network such as the Internet, a local area network (LAN), a wide area network (WAN), etc. The client computing device may be a master client computing device configured to control a BIM engine executed by the server, in one example. Further in one example, the identification data includes a common identification number. Specifically in such an example, the common identification number is embedded in data structures in each of the COBie spreadsheet, the building model, and the hierarchical structure of building model data.

Further in one example, the hierarchical structure of building model data is a hierarchical tree structure with a root value of sub-trees of children, represented as a set of linked nodes. Further in one example, the building model includes a 3-dimensional rendering of a structure. Still further in one example, The COBie spreadsheet may be color coded according to a predetermined standard.

Next at 504 the method includes receiving the save tri-dimensional data command at the BIM server. At 506 the method includes in response to receiving a save tri-dimensional data command from the client computing device, associatively mapping identification data for display in each of the building model, the hierarchical structure of building model data, and the COBie spreadsheet. In one example, the building model includes viewing perspective data corresponding to a view presented on the client computing device. In this way, a user's viewing angle may be saved.

Further in another example, associatively mapping identification in the building model, the hierarchical structure of building model data, and the COBie spreadsheet includes linking common identification data (e.g., a common identification number) embedded in data structures in each of the building model, the hierarchical structure of building model data, and the COBie spreadsheet. Therefore, it will be appreciated that the identification data may include at least one of a common identification number. In this way, a marker may be used to connect the different data sets. As a result, data in these separate data structures can be quickly linked, increasing processing efficiency when retrieving data in the separate data structures.

At 508 the method includes storing a representation of the associative mapping of the identification data for display in at least one of the BIM server and a client computing device in electronic communication with the server over a network. In one example, the network is the Internet. In another example, the network may be a local area network (LAN).

Next at 510 the method includes sending a request for retrieval of the associatively mapped identification data to the BIM server. At 512 the method includes receiving the request for retrieval of the associatively mapped identification data. The request may include a common identification number included in a saved iteration of the building model, the hierarchical structure of building model data, and the COBie spreadsheet. In this way, associated data sets may be efficiently retrieved.

At 514 the method includes retrieving the associatively mapped identification data in the BIM server. Next at 516 the method may include in response to retrieving the associatively mapped identification data generate a graphical user interface (GUI) simultaneously presenting a view of the building model, the hierarchical structure of building model data, and the COBie spreadsheet based on the associative mapping. In one example, the method may further include sending the GUI to the client computing device for display.

At 518 the method includes sending a command to the BIM server requesting alteration of data in the building model. Next at 520 the method includes receiving the command to alter data in the building model and altering data in the building model in response to receiving the command.

In one example, altering data in one or more of the building model, the hierarchical structure of building model data, and the COBie spreadsheet includes altering the view of the building model. Altering the view of the building model may include adjusting view coordinates and/or a viewing vector via the client computing device. It will be appreciated that the aforementioned adjustment may be implemented through network communication between the BIM server and the client computing device. For instance, the client computing device may access a network-based program provided by the BIM server to provide the aforementioned functionality. Further in some examples, the altered viewing coordinates and/or viewing vector may be sent to other client computing device in electronic communication with the BIM server over the network. Additionally, it will be appreciated that altering data in the building model, hierarchical structure, or the COBie spreadsheet may trigger adjustment of data in the remaining data sets. For instance, an object in the building model may be selected and in response to the selection a directory, sub-directory, etc., associated with the object may be highlighted or otherwise indicated in the hierarchical structure. Furthermore, one or more selected cells associated with the object in the COBie spreadsheet may be highlighted, displayed, etc.

At 522 the method includes alter data in the hierarchical structure of building model data, and the COBie spreadsheet based on the data altered in the building model. The method may also include, at the BIM server, generating an updated GUI based on the data altered in the hierarchical structure of building model data, and the COBie spreadsheet, sending the updated GUI to the client computing device, and displaying the updated GUI at the client computing device. It will be appreciated that the BIM engine may be stored in memory executable by a processor in the BIM server. Additionally, it will be appreciated that steps 504, 506, 508, 512, 514, 516, 520, and/or 522 may be implemented via a BIM engine, in one example.

Figure 6:
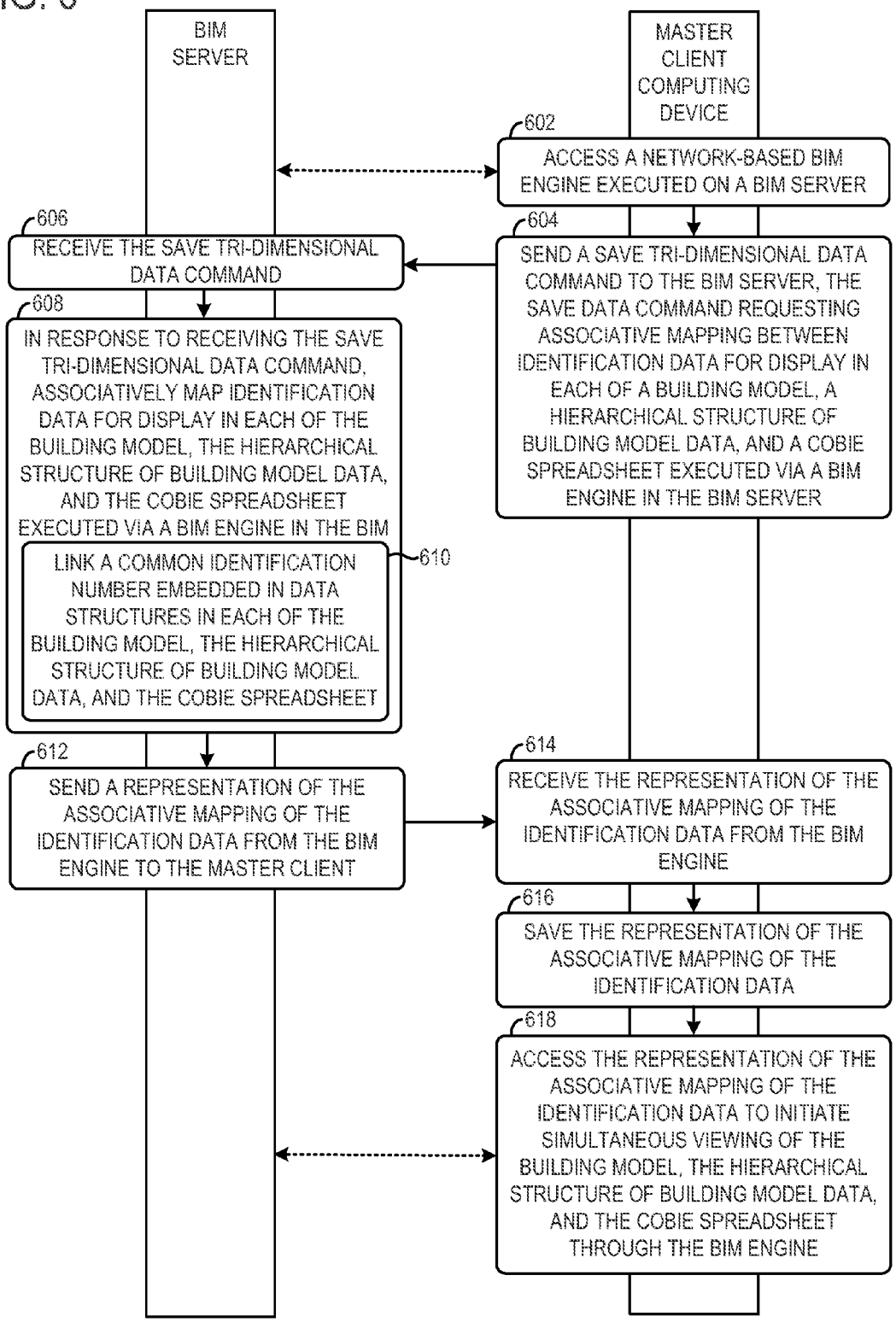

FIG. 6 shows a method 600 for operating of a BIM system. The BIM system may be the BIM system 200 discussed above with regard to FIG. 2, in one example. However, in another example other suitable BIM systems may be used to implement the method 600.

At 602 the method includes at a master client computing device accessing a network-based BIM engine executed on a BIM server and at 604 the method includes sending a save tri-dimensional data command to the BIM server, the save data command requesting associative mapping between identification data for display in each of a building model, a hierarchical structure of building model data, and a COBie spreadsheet executed via a BIM engine in the BIM server. In one example, the building model is a 3-dimensional rendering of a building and the COBie spreadsheet includes a plurality of cells populated with COBie formatted data.

In one example, the hierarchical structure of building model data may be a hierarchical tree structure with a root value and sub-trees of children, represented as a set of linked nodes, the building model includes a 3-dimensional rendering of a structure, and the COBie spreadsheet is a spreadsheet conforming to predetermined standards. Further in one example, the building model is a 3-dimensional rendering of a structure and the COBie spreadsheet includes a plurality of cells populated with COBie formatted data. Still further in one example, associatively mapping of the identification includes linking a common identification number embedded in data structures each of the building model, the hierarchical structure of building model data, and the COBie spreadsheet.

At 606 the method includes receiving the save tri-dimensional data command at the BIM server. Next at 608 the method includes, at the BIM server, in response to receiving the save tri-dimensional data command, associatively map identification data in each of the building model, the hierarchical structure of building model data, and the COBie spreadsheet executed via a BIM engine in the BIM server. Associatively mapping the identification data may include linking a common identification number embedded in data structures in each of the building model, the hierarchical structure of building model data, and the COBie spreadsheet at 610.

At 612 the method includes, at the BIM server, sending a representation of the associative mapping of the identification data from the BIM engine to the master client and at 614, at the master client computing device, receiving the representation of the associative mapping of the identification data from the BIM engine. At 616 the method includes, at the master client computing device, saving the representation of the associative mapping of the identification data in the master client computing device. Next at 618 the method includes, at the master client computing device, accessing the representation of the associative mapping of the identification data to initiate simultaneous viewing of the building model, the hierarchical structure of building model data, and the COBie spreadsheet through the BIM engine. It will be appreciated that the master client computing device may use a network browsing program to access the representation of the associative mapping. The method may further include in one example, accessing the building model, the hierarchical structure of building model data, and the COBie spreadsheet via a slave computing device and inhibiting the slave computing device from controlling the BIM engine.

FIGS. 7-13 show various example GUI's which may be generated via the BIM engine 204 and accessed via the network browsing programs (220 and 224) included in the client computing devices (218 and 222), discussed above with regard to FIG. 2.

Figure 7:
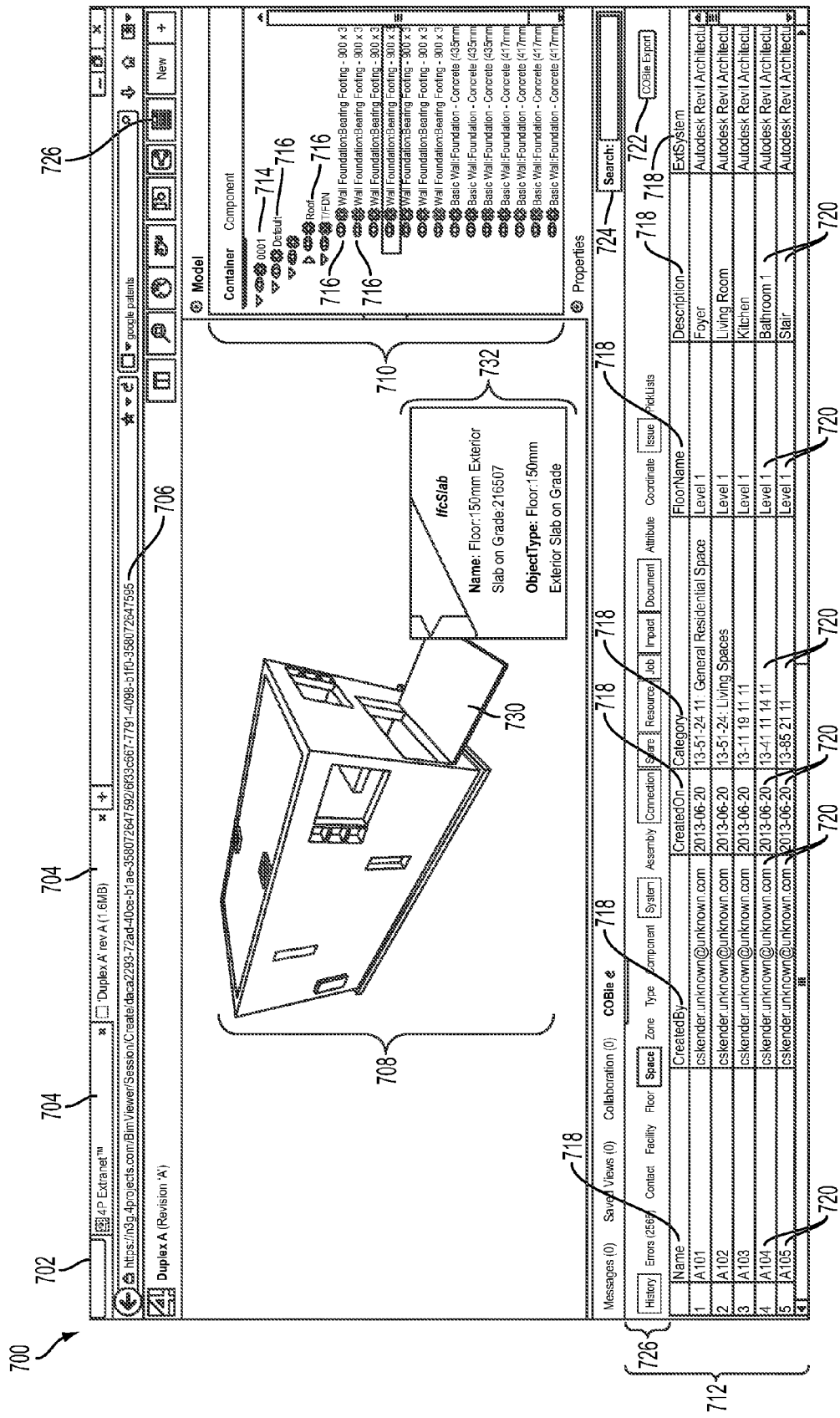
FIGS. 7-13 show example graphical user interfaces (GUIs) that may be generated and viewed in the BIM system shown in FIG. 2.

Specifically, FIG. 7 shows a GUI 700 included in a browser window 702. It will be appreciated that the browser window 702 may executed on a client computing device such as the master client computing device 218 and the slave client computing devices 222, shown in FIG. 2.

The browser window 702 may include tabs 704 and a network address field 706. The network address field 706 enables the browser to access the BIM engine 204, shown in FIG. 2, via the network 206, shown in FIG. 2. The GUI 700 includes a building model 708, a hierarchical structure of building model data 710, and a COBie spreadsheet 712. The building model 708 includes graphical representations of building objects, structures, etc., such as walls, windows, roofs, etc. Additionally, the hierarchical structure of building model data 710 includes directories 714 and sub-directories 716. The directories and sub-directories are related to objects in the building model. In this way, a user may easily disseminate how objects in the model are conceptually organized in a data structure. Each of the directories and sub-directories may include icons and alphanumeric symbols. Specifically, in one example the hierarchical structure of building model data 710 is a hierarchical tree structure with a root value and sub-trees of children, represented as a set of linked nodes. The directories may be the root value and the sub-trees of children may be the sub-directories.

The COBie spreadsheet 712 includes categories 718 and category fields 720. The category fields may be more generally referred to as cells. The cells may be populated by data entered via a user. The categories 718 may include an object name, a name of the creator of the object, a date of object creation, a floor name, a description of the object, and an associated external system. The category fields 720 include COBie formatted data. Additionally, the COBie spreadsheet may be color coded based on the type of data in the spreadsheet field. As previously discussed, the COBie data may be validated via a BIM engine. It will be appreciated that interaction with one of the building model 708, the hierarchical structure of building model data 710, and the COBie spreadsheet 712 may initiate changes in the other two features. In this way, information across these data sets may be linked. It will be appreciated that each of the aforementioned features are bounded in panels adjacent to one another, in the depicted example. Specified objects such as roofs, floors, stairs, and walls are arranged in a tree structure in the depicted example. Each of the objects may have a specific identification number.

Further in one example, clicking an object (e.g., structural item) in the 3-dimensional building model brings the structural item into view in the hierarchical structure and displays the objects COBie data in the COBie spreadsheet. Likewise, clicking the item on the hierarchical structure with display the item's COBie data on COBie spreadsheet and highlight the item in the 3-dimensionial building model. A COBie export 722 button is also provided in the GUI 700 to enable COBie data to be exported to other computing devices, systems, etc. A search tool 724 is also provided in the GUI 700. Categories 726 such as history, errors, contact, facility, floor, space, zone, type, component, system, assembly, connection, spare, resource, job, impact, document, attribute, coordinate, issue, and/or PickLists are also provided in the GUI. A save button 728 may also be configured to generate a save command that may be sent to the BIM server to initiate storing of various data associated with each of the building model, the hierarchical structure, and the COBie spreadsheet, as previously discussed.

In one example, some objects in the building model 708 are made partially transparent to facilitate viewing of interior objects. Thus, an x-ray option that can be activated allowing a user to view interior structures of the building model through the walls. Further in one example, the GUI 700 may shows an interior view of the building model as witnessed by the 3-dimensional camera that is configured to move around the 3D image in a plurality of ways including an orbiting mode and a helicopter mode.

Additionally, the GUI 700 shows how hovering over an item or clicking an object 730 in the 3D viewer will display certain information 732 related to that item in the 3D viewer. Such information may include but are not limited to: item name, item dimensions, item serial number, color, creation date, and creator name.

Figure 8:
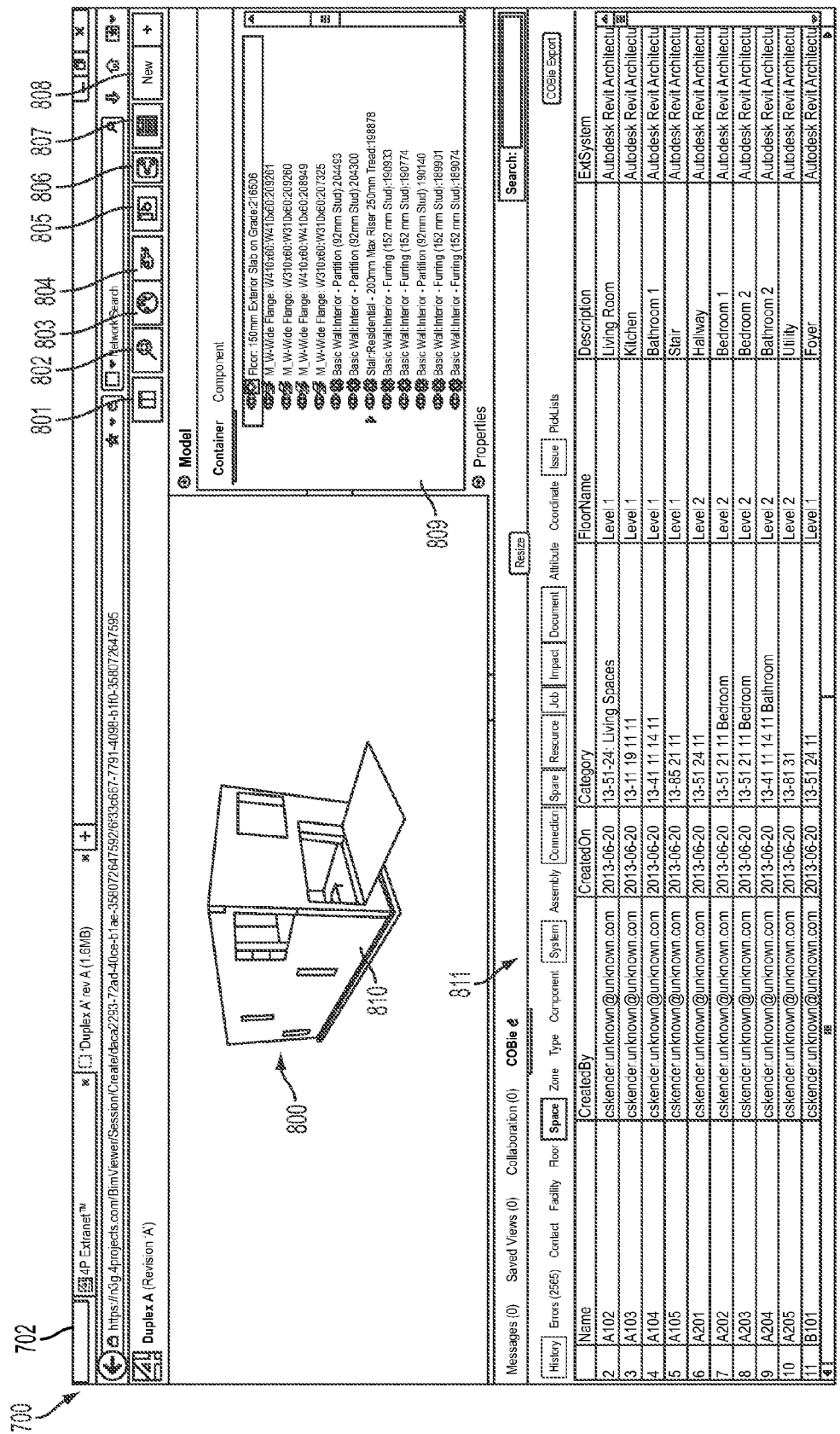

FIG. 8 shows another aspect of the GUI 700 included in the browser window 702. Specifically, FIG. 8 details optional tools within the interface for accessing the building model. 800 indicates a 3D viewer. 801 indicates an x-ray view button. 802 indicates a zoom tool. 803 indicates a camera orbiting mode button. 804 indicates a helicopter camera viewing button. 805 indicates a button that takes a screenshot. 806 indicates a button that creates a shared session between the current BIM viewer and another user. 807 indicates a button that saves a current view point in the building model so that a user can return to the viewpoint at a later time. This effectively stores the state of the viewer in terms of parameters like current camera position, visibility state, camera mode (e.g., orbit, helicopter, etc.,) xray mode, etc. The button, indicated at 807, also take a thumbnail screenshot of the viewpoint so that the user can visualize the saved view, in one example. A button that saves changes to the building model may also be provided, in some examples. 808 indicates a button that allows the user to make a new task or discussion relating to the building model. Tasks and discussions may include but are not be limited to titles, screenshots, dates, deadlines, folders, names of responsible individuals, location, and text editing features like highlighting and fonts. 809 indicates a hierarchical structure (e.g., item tree) for the structure of interest; items may be organized by type, floor, location, or other sub categories. 810 indicates the 3-D building model. 811 indicates the COBie spreadsheet panel containing COBie data related to the structure of interest.

Figure 9:
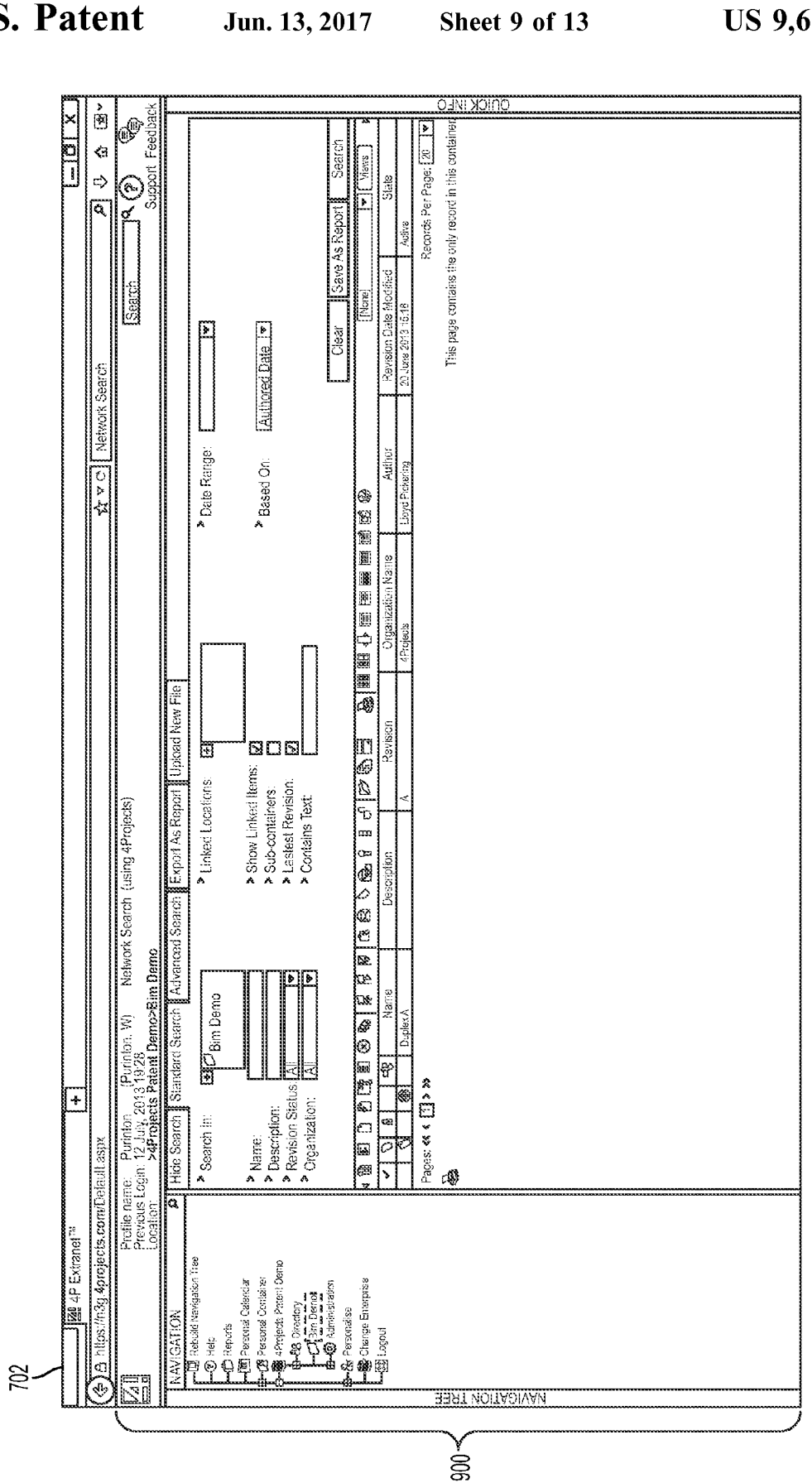

FIG. 9 is an example of an access page 900 that allows a user to access the BIM viewer. The access page 900 is presented in the browser window 702. A user can log into the web site with a username and password to verify that they are authorized to have access to certain BIM information and content. In this way, the building model, COBie spreadsheet, and hierarchical structure can be accessed online. This allows one user to manage multiple projects and schedules related to those projects. Additionally, fields are provided in the access page 900 to enable a user to select various stages of project revisions as well as link items in the project to other files.

Figure 10:
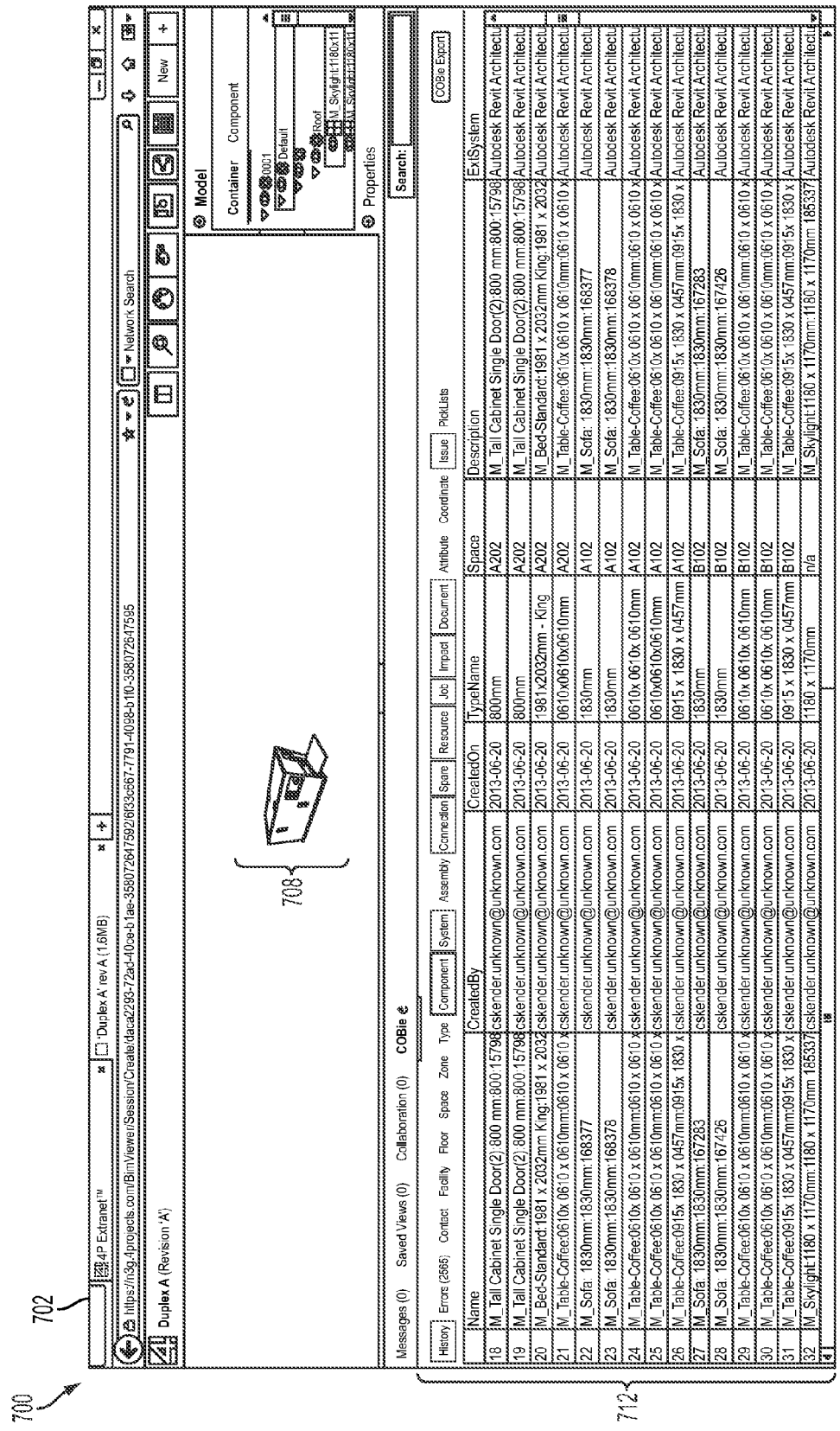
Figure 11:
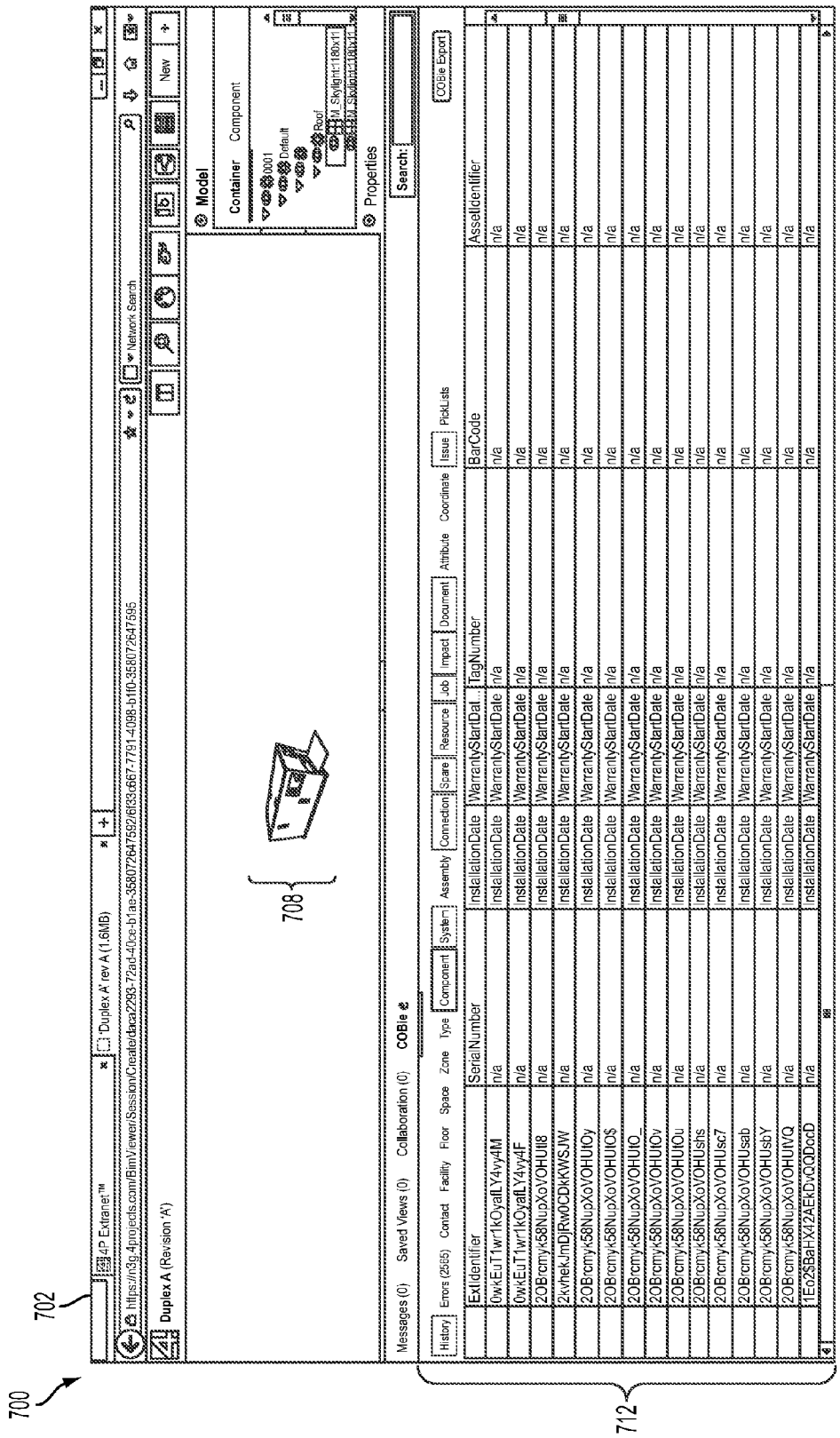
Figure 12:
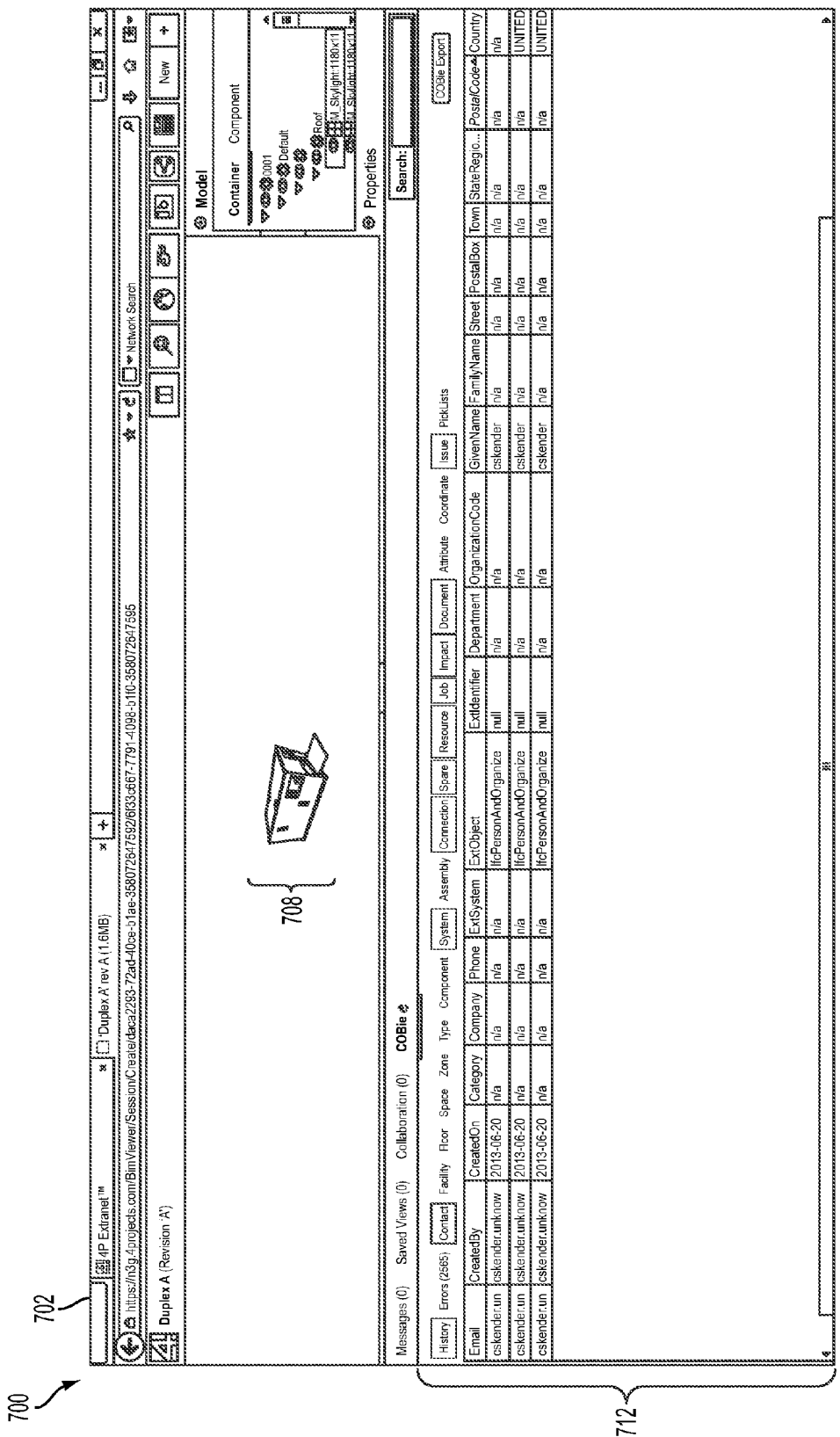
Figure 13:
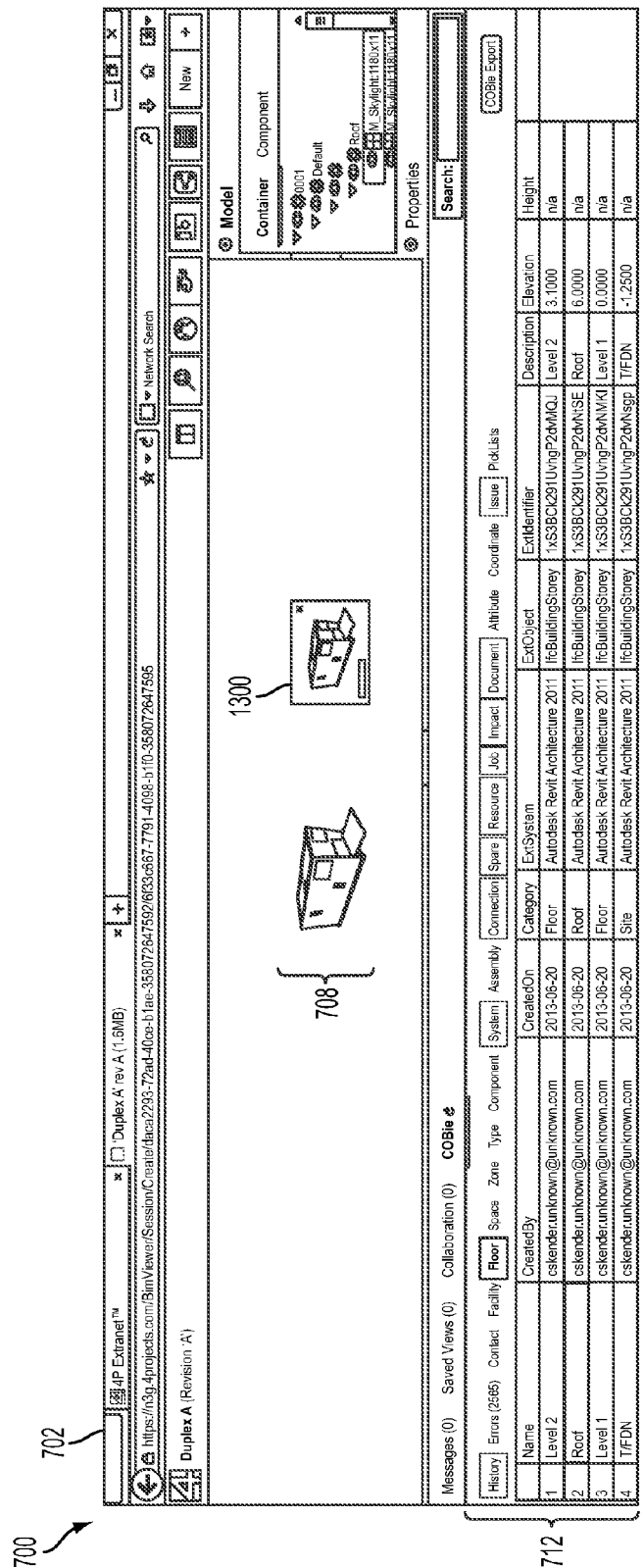

FIGS. 10-13 show other aspects of the GUI 700 in the browser window 702. Specifically, FIGS. 10-13 show different displayable options that can be viewed in the COBie spreadsheet 712 pertaining to items within the building model 708, matters and information pertaining to the building model, and information that may connect the building model to other building models. This information can be displayed in any order or arrangement in addition to other information that may also be pertinent to the user's purposes within the realm of variation that an individual of normal skill in the art would have access to. Specifically, FIG. 10-11 show the COBie spreadsheet 712 populated with data related to components in the model. FIG. 12 shows the COBie spreadsheet 712 populated with data related to contacts associated with object in the model. FIG. 13 show the COBie spreadsheet 712 populated with data related to floors in the building model.

FIG. 13 additionally shows the use of saved screenshots 1300 or saved camera positions (both possible within the embodiments of the BIM system) for quickly navigating the 3D model and for presentation purposes. It will be appreciated that a user of a client computing device may initiate saving the screenshots through interactive input with the GUI 700. In one example, the BIM engine may provide an item view deactivation option where individual objects may be selected in the hierarchical structure and made temporarily invisible in the 3D viewer for better viewing of the 3D building model.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for operating a building information modeling (BIM) system, comprising:
at a BIM server, in response to receiving a save data command from a client computing device, associatively mapping identification data in each of a building model, a hierarchical structure of building model data, and a Construction Operations Building Information Exchange (COBie) spreadsheet, the associative mapping including embedding a globally unique identifier in data structures in each of the COBie spreadsheet, the building model, and the hierarchical structure of building model data and the building model including a 3-dimensional rendering of a structure with a plurality of selectable objects including one or more of a section, a floor, and a system; and
storing a representation of the associative mapping of the identification data for display in at least one of the BIM server and the client computing device in electronic communication with the server over a network.

2. The method of claim 1, where the client computing device is a master client computing device and the method further comprises at the master client computing device sending a command to the BIM server requesting alteration of data in the building model.

3. The method of claim 2, further comprising, at the BIM server, altering data in the hierarchical structure of building model data, and the COBie spreadsheet based on the data altered in the building model.

4. The method of claim 1, where the hierarchical structure of building model data is a hierarchical tree structure with a root value and sub-trees of children, represented as a set of linked nodes.

5. The method of claim 1, where the COBie spreadsheet is color coded according to a predetermined standard.

6. The method of claim 1, where the save data command is sent to the BIM server from the client computing device over the Internet.

7. A method for operating a building information modeling (BIM) system, comprising:
at a master client computing device, accessing a network-based BIM engine executed on a BIM server; and
sending a save data command to the BIM server, the save data command requesting associative mapping between identification data for display in each of a building model, a hierarchical structure of building model data, and a Construction Operations Building Information Exchange (COBie) spreadsheet executed via the BIM engine in the BIM server, the associative mapping including embedding a globally unique identifier in data structures in each of the COBie spreadsheet, the building model, and the hierarchical structure of building model data and the building model including a 3-dimensional rendering of a structure with a plurality of selectable objects including one or more of a section, a floor, and a system.

8. The method of claim 7, further comprising at the master client computing device, receiving a representation of the associative mapping of the identification data from the BIM engine and saving the representation of the associative mapping of the identification data for display.

9. The method of claim 8, where the hierarchical structure of building model data is a hierarchical tree structure with a root value and sub-trees of children, represented as a set of linked nodes, the building model includes the 3-dimensional rendering of the structure, and the COBie spreadsheet is a spreadsheet conforming to predetermined standards.

10. The method of claim 7, where the building model is a 3-dimensional rendering of a structure and the COBie spreadsheet includes a plurality of cells populated with COBie formatted data.

11. A building information modeling (BIM) system comprising:
a BIM server providing a network-based BIM engine to a plurality of computing devices over a network; and
a client computing device in electronic communication with the BIM server via the network configured to send a save data command to the BIM engine, the save data command configured to request associative mapping between identification data for display in each of a building model, a hierarchical structure of building model data, and a Construction Operations Building Information Exchange (COBie) spreadsheet executed via the BIM engine in the BIM server, the associative mapping including embedding a globally unique identifier in data structures in each of the COBie spreadsheet, the building model, and the hierarchical structure of building model data and the building model including a 3-dimensional rendering of a structure with a plurality of selectable objects including one or more of a section, a floor, and a system.

12. The BIM system of claim 11, where the building model is a 3-dimensional rendering of a structure, the COBie spreadsheet includes a plurality of cells populated with COBie formatted data and the hierarchical structure is a tree structure.

13. The BIM system of claim 11, where the client computing device is a master client computing device configured to control the BIM engine.

14. The BIM system of claim 13, further comprising a slave client computing device in electronic communication with the server, the slave client computing device configured to access the building model, the hierarchical structure of building model data, and the COBie spreadsheet and inhibited from controlling the BIM engine.

15. The BIM system of claim 11, where the network is the Internet.

* * * * *